United States Patent
Tan et al.

(10) Patent No.: US 12,008,337 B2
(45) Date of Patent: Jun. 11, 2024

(54) MULTI-INPUT CONFIGURABLE LOGIC CELL WITH CONFIGURABLE OUTPUT REGION

(71) Applicant: OPPSTAR TECHNOLOGY SDN BHD, Bayan Lepas (MY)

(72) Inventors: Kim Pin Tan, Jelutong (MY); Kok Keong Liaw, Kepong (MY); Hun Wah Cheah, Batu Mauang (MY)

(73) Assignee: OPPSTAR TECHNOLOGY SDN BHD, Bayan Lepas (MY)

( * ) Notice: Subject to any disclaimer, the term of this patent is extended or adjusted under 35 U.S.C. 154(b) by 263 days.

(21) Appl. No.: 17/474,859

(22) Filed: Sep. 14, 2021

(65) Prior Publication Data
US 2023/0077881 A1  Mar. 16, 2023

(51) Int. Cl.
*G06F 7/53* (2006.01)
*G06F 7/508* (2006.01)

(52) U.S. Cl.
CPC ............ *G06F 7/5318* (2013.01); *G06F 7/508* (2013.01)

(58) Field of Classification Search
CPC ... H03K 19/173–17796; H03K 17/693; H03K 19/1737; G06F 7/38–575
See application file for complete search history.

(56) References Cited

U.S. PATENT DOCUMENTS

| | | | |
|---|---|---|---|
| 6,877,020 B1* | 4/2005 | Bratt ....................... | G06F 7/785 708/400 |
| 7,375,552 B1* | 5/2008 | Young .............. | H03K 19/17736 326/38 |
| 7,565,388 B1* | 7/2009 | Baeckler ................. | G06F 7/509 708/235 |
| 2016/0246571 A1* | 8/2016 | Walters, III ........... | G06F 7/5057 |
| 2017/0322775 A1* | 11/2017 | Padalia ................ | H03K 19/177 |

OTHER PUBLICATIONS

N. Vinod et al., "Performance Evaluation of LUTs in FPGA in Different Circuit Topologies," 2020 International Conference on Communication and Signal Processing (ICCSP), Chennai, India, 2020, pp. 1511-1515. (Year: 2020).*

(Continued)

*Primary Examiner* — Jyoti Mehta
*Assistant Examiner* — Vivian Diem Ha Ledynh
(74) *Attorney, Agent, or Firm* — Tutunjian & Bitetto, P.C.

(57) ABSTRACT

Configurable circuits include an input selection region, a computation region, a switching region, and an output region. The input selection region includes a set of input multiplexers and selects and routes input signals. The computation region includes a set of lookup tables, each lookup table being coupled to selected signals from the input selection stage to generate a respective output signal. The switching region includes a set of output multiplexers, each output multiplexer being coupled to output signals from the set of lookup tables to provide circuit outputs responsive to respective output selection signals. The output region includes a domino logic stage, having a set of transistors, coupled to output signals from the set of lookup tables to provide circuit outputs that determine combinations of the signals output by the set of lookup tables.

20 Claims, 8 Drawing Sheets

(56) References Cited

OTHER PUBLICATIONS

Boutros, Andrew, et al. "Math doesn't have to be hard: Logic block architectures to enhance low-precision multiply-accumulate on FPGAs." Proceedings of the 2019 ACM/SIGDA International Symposium on Field-Programmable Gate Arrays. 2019. (Year: 2019).*

N.a., "FPGA Basics: Architecture, Applications and Uses," Arrow Electronics, Sep. 24, 2018. Retrieved from Wayback Machine Snapshot on Jul. 26, 2020. (Year: 2018).*

Anonymous. "7 Series FPGAs Configurable Logic Block User Guide", Xilinx, www.xilinx.com.Sep. 27, 2016, pp: 1-74.

Anonymous. "UltraScale Architecture Configurable Logic Block", Xilinx All Programmable, www.xilinx.com. Feb. 28, 2017, pp. 1-58.

Anonymous. "Intel® Stratix® 10 Logic Array Blocks and Adaptive Logic Modules User Guide", Intel Corporation. Apr. 24, 2020, pp. 1-18.

* cited by examiner

MULTI-INPUT CONFIGURABLE LOGIC CELL WITH CONFIGURABLE OUTPUT REGION

BACKGROUND

Technical Field

Described herein are embodiments related to configurable logic cells, and, more particularly, to a multi-input configurable logic cell that uses lookup tables.

Description of the Related Art

Using lookup tables for logic operations can provide rapid computation, and are used in field programmable gate array (FPGA) devices to provide reconfigurable logic operation structures. However, as the density of a lookup table-based circuit increases, maximizing the circuit performance while minimizing the area and keeping the power consumption low becomes more challenging, and the number of devices needed to implement the circuit can increase rapidly.

SUMMARY

A configurable circuit includes an input selection region, a computation region, a switching region, and an output region. The input selection region includes a set of input multiplexers and selects and routes input signals. The computation region includes a set of lookup tables, each lookup table being coupled to selected signals from the input selection stage to generate a respective output signal. The switching region includes a set of output multiplexers, each output multiplexer being coupled to output signals from the set of lookup tables to provide circuit outputs responsive to respective output selection signals. The output region includes a domino logic stage, having a set of transistors, coupled to output signals from the set of lookup tables to provide circuit outputs that determine combinations of the signals output by the set of lookup tables.

A configurable circuit includes an input selection region, a computation region, a switching region, and an output region. The input selection region includes a set of four input multiplexers, that selects and routes input signals. The computation region includes a set of four four-input lookup tables, each lookup table being coupled to selected signals from the input selection stage to generate a respective output signal, with the computation region being split to perform multiple logic operations. The switching region includes a set of output multiplexers, each output multiplexer being coupled to output signals from the set of lookup tables to provide circuit outputs responsive to respective output selection signals. The output region includes a domino logic stage, having a set of transistors, coupled to output signals from the set of lookup tables to provide circuit outputs that determine combinations of the signals output by the set of lookup tables. Only one of the switching region or the output region is active for any given operation.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Configurable logic cells are described herein, providing a multi-function logic block that can be configured to perform multiple simultaneous functions by configuring input and output circuitry for a set of lookup tables (LUTs). The configurable logic cells may be configured for use for a number of different applications, including area-efficient arithmetic and various different multi-input logic operations with differing numbers of inputs.

It is specifically contemplated that a multiple input configurable cell may be used with input multiplexing and fast domino AND-OR logic output, using a set of LUTs to provide configurable logic operations. It is specifically contemplated that the configurable cell may accept up to 9 inputs, including a carry signal, and may use four-input LUTs to perform computation, but it should be understood that the present principles may be applied for different numbers of inputs. Configurations of the present embodiments may provide wide logic functions within a single cell and across multiple cells. The configurable cells may also provide multiple simultaneous logic operations through cell fracturing, for example providing multiple independent functions, each having fewer than six inputs. In the context of a programmable logic device (PLD), such as a field programmable gate array (FPGA), the present configurable logic cell may be used to flexibly perform a variety of different tasks.

Figure 1:
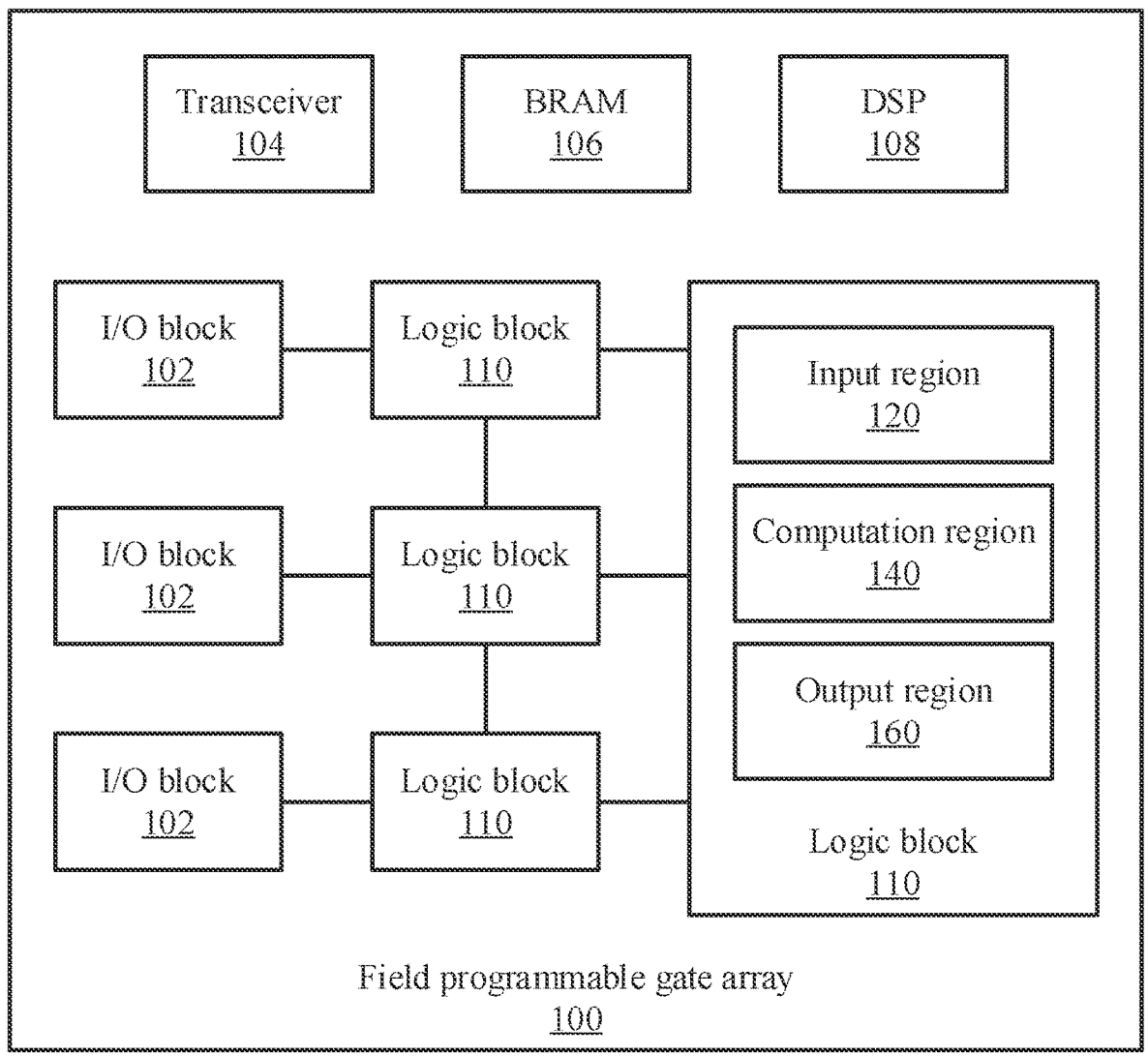
FIG. 1 is a block diagram of a field programmable gate array device that includes logic blocks that implement configurable logic cells, in accordance with an embodiment of the present invention.

Referring now to FIG. 1, a block diagram of an illustrative embodiment of an FPGA 100 is shown. The FPGA 100 includes a fabric of configurable logic blocks 110. These logic blocks 110 represent hardware components that are defined at run-time, according to hardware definition instructions. For example, the logic blocks 110 may include lookup tables LUTs that perform arbitrary computations, and may include further components, such as latches, digital logic, multiplexers, and other transistors. The logic blocks 110 may have a relatively simple internal structure, with complex operations being performed by connecting multiple logic blocks 110 using configurable interconnects. The logic blocks 110 may also have a relatively complex internal structure, with specific functions being performed according to internal configurations of the logic blocks 110. The logic blocks 110 may have differing internal structures, in accordance with the configuration of the FPGA 100. Input/output (I/O) blocks 102 provide inputs and outputs to the fabric of logic blocks 110.

The functions of the FPGA 100 may be configured at start-up, and may further be reconfigured or partially reconfigured during runtime. Thus, logic blocks 110 may be initialized with a first function when the device is powered up, and may later be reconfigured to perform different functions, for example responsive to an error or changing operational conditions.

Other components of the FPGA may perform specific, hard-wired functions. For example, a transceiver 104 may provide communications with off-chip devices, block random access memory (BRAM) 106 may provide dedicated on-die data storage, and digital signal processor (DSP) 108 may provide complex signal computations. While these functions could be performed using circuitry that is implemented in the fabric of logic blocks 110, the inclusion of dedicated hardware components for common functions maximizes the available space for implementing user designs.

In some illustrative embodiments, the logic blocks 110 may include a configurable logic cell that has an input region 120, a computation region 140, and an output region 160. As will be described in greater detail below, the computation region 140 may be implemented using LUTs, with multiplexers to provide further computation inputs or to fracture the cell into multiple operations, as needed. The input region 120 selects inputs that are provided to selected parts of the computation region 140, and the output region 160 performs any further processing of the outputs of the computation region 140 to generate outputs for the logic block 110.

During an implementation phase, before placement and routing are performed for the logic blocks 110, logic packing may be performed. Logic packing may include register packing and may be performed when users compile a design. Logic and registers may be packed based on hardware capability and design constraints. Thus, for example, if a user selects an area-based implementation, then the user's design may be implemented with multiple operations being performed by a single logic cell 110.

Figure 2:
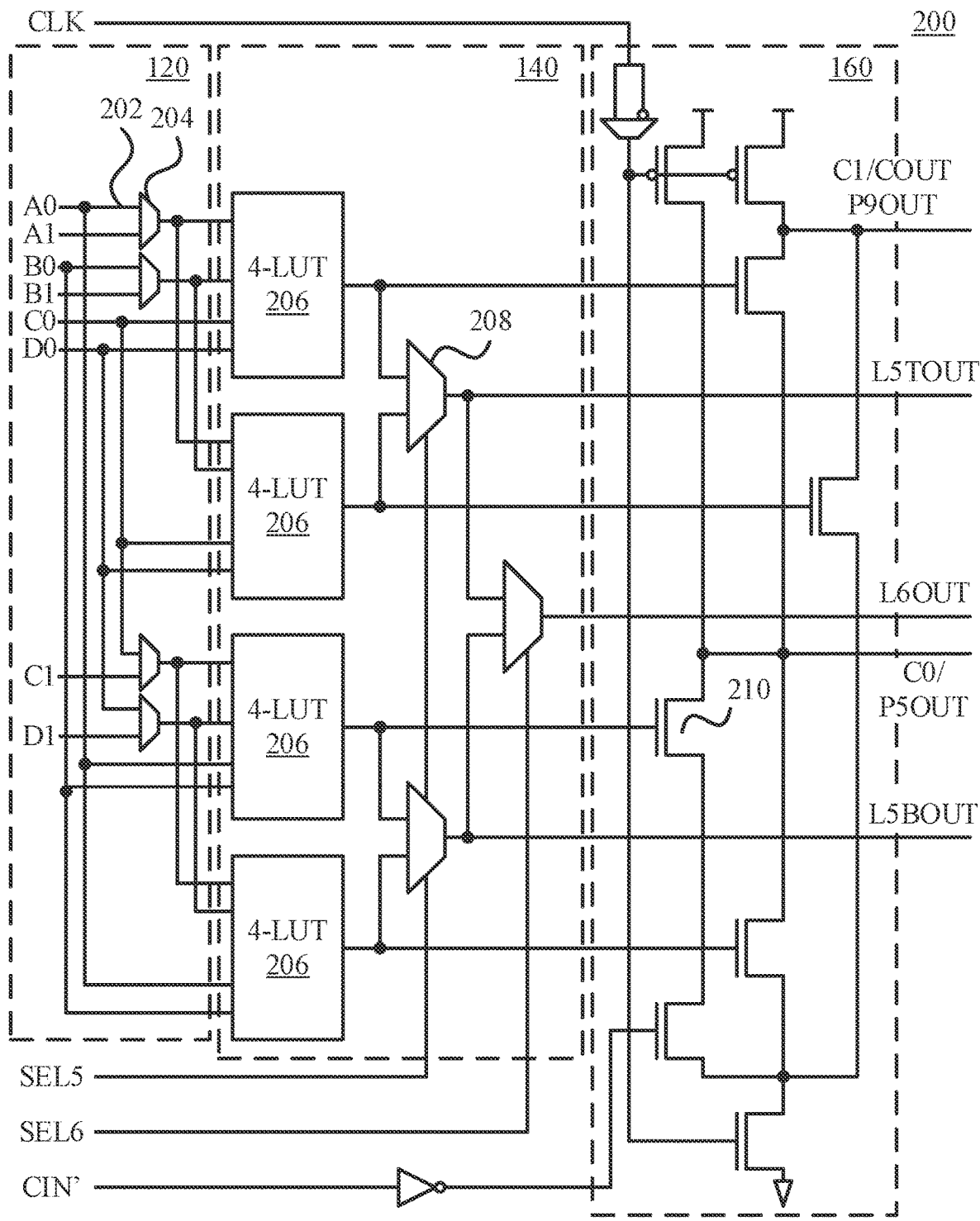
FIG. 2 is a circuit schematic of a configurable logic cell that can be configured to perform a variety of different functions, include two-bit carry-look-ahead arithmetic, and can further be split to perform multiple operations at once, in accordance with an embodiment of the present invention.

Referring now to FIG. 2, a circuit diagram is shown that illustrates a configurable logic cell 200 in accordance with an illustrative embodiment. This configurable logic cell 200 may be implemented as one or more logic blocks 110 within an FPGA 100, or may be implemented as a fixed circuit. The cell 200 includes three sub-components, including an input distribution region 120, a computation region 140, and an output region 160. The input region 120 includes a number of input signals 202 which are selectively distributed using multiplexers 204. Although it is specifically contemplated that there may be eight such input signals 202 and four two-to-one input multiplexers 204, it should be understood that other numbers and combinations of signals and multiplexers may be used, in accordance with the configuration of the computation region 140. For example, by increasing the number of LUTs 206, with the corresponding input, selection, and output processing circuitry, the number of input signals 202 may be increased.

It should be understood that the configurable logic cell 200 may be part of a larger circuit. As a result, additional circuitry, including additional multiplexers, switches, and other logic, may be needed to connect the configurable cell 200 to other device components. This additional circuitry is not explicitly shown herein, but it should be understood that any appropriate circuitry may be used for a given circuit design. Additionally, in the context of an FPGA, such circuitry, like routing circuitry, may also be used for other components, such as BRAM 106, DSP 108, and IO 102.

During operation, the input multiplexers 204 may be used to select between different input signals. For example, one multiplexer selects between input signals A0 and A1, another selects between input signals B0 and B1, and so on. This multiplexing makes it possible to homogeneously fracture the configurable cell into two halves. The term "fracturing" a cell can refer to using the cell to perform multiple distinct operations, to performing multiple operations with shared inputs, to performing a combination of full operations and partial operations, and other configurations. The input region 120 thereby selects four sets of four outputs, each set including a respective A, B, C, and D signal, to be passed to respective LUTs 206 in the computation region 140.

The computation region 140 includes a set of LUTs 206. While it is specifically contemplated that four-input LUTs may be used, it should be understood that other numbers of inputs may be used instead, with corresponding numbers of inputs being provided by the input region 120. The LUTs 206 may be configured with any appropriate logic operations, providing an output that corresponds to the signals output by the input region 120.

The computation region further includes a set of output multiplexers 208, which provide for selection between the outputs of the LUTs 206. The operation of these multiplexers 208 are controlled by select signals SEL5 and SEL6. The select signals may be used for configuring the operation of the cell, providing additional inputs to a logic operation that involves the use of multiple LUTs 204. Thus, multiple four-input LUTs 206 may be used to implement logic operations with larger numbers of inputs by using an appropriate select signal and the multiplexers 208.

The LUTs 206 also provide their outputs directly to the output region 160. The output region 160 may include a set of transistors 210 that implement domino logic structures that may configured to provide wide logic functions and that may be configured as fast domino drivers. The domino logic can be configured to form fast carry-look-ahead circuit for arithmetic operations. When the configuration of the output region 160 is used with the input multiplexing of the input region 120, the configurable cell can be used to implement wide logic functions with up to nine inputs or can be split into two independent four-input operations.

A number of different output signals may be provided by the output region 160, depending on the configuration of the cell. For example, signals L5TOUT and L5BOUT represent outputs for five-input LUT-based operations in a split cell configuration, with L5TOUT providing the output of the five-input operation that is set by the top two LUTs 206 and with L5BOUT providing the output of the five-input operation that is set by the bottom two LUTs 206. The L6OUT signal represents the output for a six-input LUT-based operation that uses all four of the LUTs 206. These outputs are generated directly by the computation region 140, which may include LUTs 206 or other circuitry, such as logic gates, a microprocessor, etc.

The remaining output signals, C1/COUT/P9OUT and C0/P5OUT, provide the outputs of other operations, using the transistors 210 of the output region 160 to perform calculations on the outputs of the LUTs 206, as will be described in greater detail below. An inverted carry signal CIN' may further be used to provide information from other configurable cells to aid in the computation. Any appropriate type of transistors may be used for the transistors 210, such as p-type or n-type metal-oxide-semiconductor (MOS) transistors. For example, p-type or n-type field effect transistors (FETs) may be used for this purpose.

Each configurable logic cell 200 may have two bits of carry-look-ahead. If a user wants a larger carry-look-ahead, such as a four-bit carry-look-ahead circuit, two configurable logic cells 200 may be cascaded by connecting the C1 output of a first configurable logic cell 200 to the CIN' input of a second configurable logic cell 200. Because domino logic may output an inverted signal, the CIN' line may include an inverter to revert the inverted signal and introduce the correct polarity of the carry bit.

Figure 3:
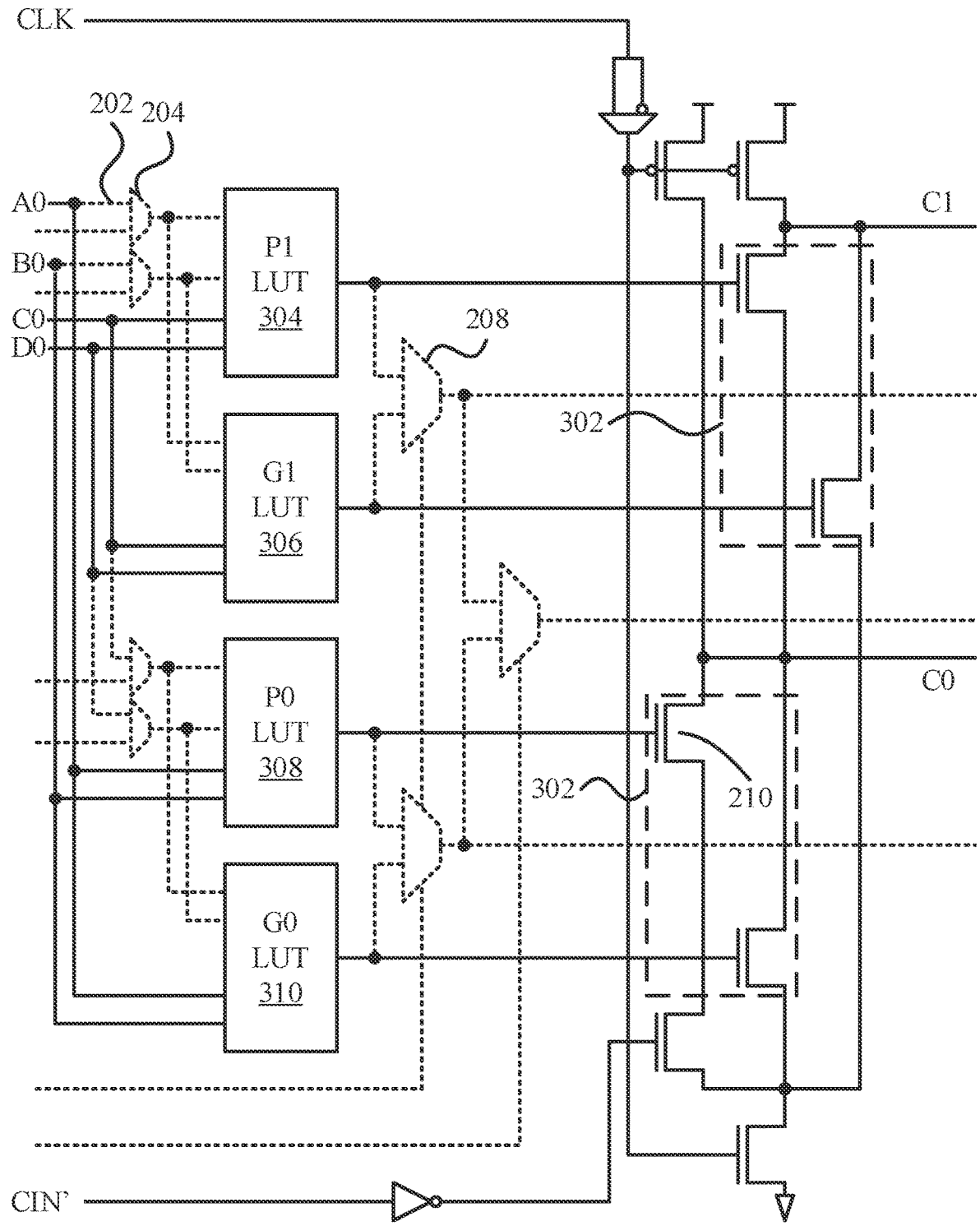
FIG. 3 is a circuit schematic that illustrates activated and deactivated portions of the configurable logic cell to show a configuration that can perform two-bit carry-look-ahead arithmetic, in accordance with an embodiment of the present invention.

Referring now to FIG. 3, a particular configuration of the configurable cell is shown, being configured to perform arithmetic. In this view, components that are deactivated are shown with dotted lines, and signals that are not being used are shown unlabeled with dotted lines. This configuration uses an area-efficient fast carry chain with a pair of transistors 302 for each propagate/generate stage. The inputs A0 and B0 go into the last stage of the bottom LUTs 206 and C0 and D0 go directly into the last stage of the top LUTs 206. The input multiplexers 204 are turned off, and the LUT output multiplexers 208 are similarly turned off, so that each LUT provides its output to a respective transistor 210 of a pair of transistors 302. This configuration implements two-bit carry-look-ahead arithmetic.

In this illustrative embodiment, the LUTs 206 are configured with particular arithmetic operations, each taking two inputs and outputting a respective output in accordance with predetermined values stored in the respective LUT. The first LUT 304 generates a signal that is calculated as P1=C0⊕D0. The second LUT 306 generates a signal that is calculated as G1=C0·D0. The third LUT 308 generates a signal that is calculated as P0=A0⊕B0. The fourth LUT 310 generates a signal that is calculated as G0=A0·B0.

These LUT operations may be understood as "generate" operations, which generate respective generate bits G0 and G1 using a logical "AND" operation (represented by the operator •), and "propagate" operations, which generate respective propagate bits P0 and P1 using a logical "XOR" operation (represented by the operator ⊕)). The propagate bits determine whether a carry bit CIN is propagated forward, and the generate bits determine whether a new carry bit is generated.

A first output bit is determined as C0=(G0+(P0·CIN))'. The expression A' refers to the inverse of A, and again, the operator + refers to a logical OR operation, and the operator · refers to a logical AND operation. A second output bit is determined as C1=(G1+(P1·G0)+(P1·P0·CIN))'. In this manner, two bits of an addition can be performed by the configurable cell, with the carry bit being correctly propagated through. These outputs may be generated with relatively few transistors, for example as compared to the use of multiplexers for look ahead carry, as only two transistors per carry bit are used.

Figure 4:
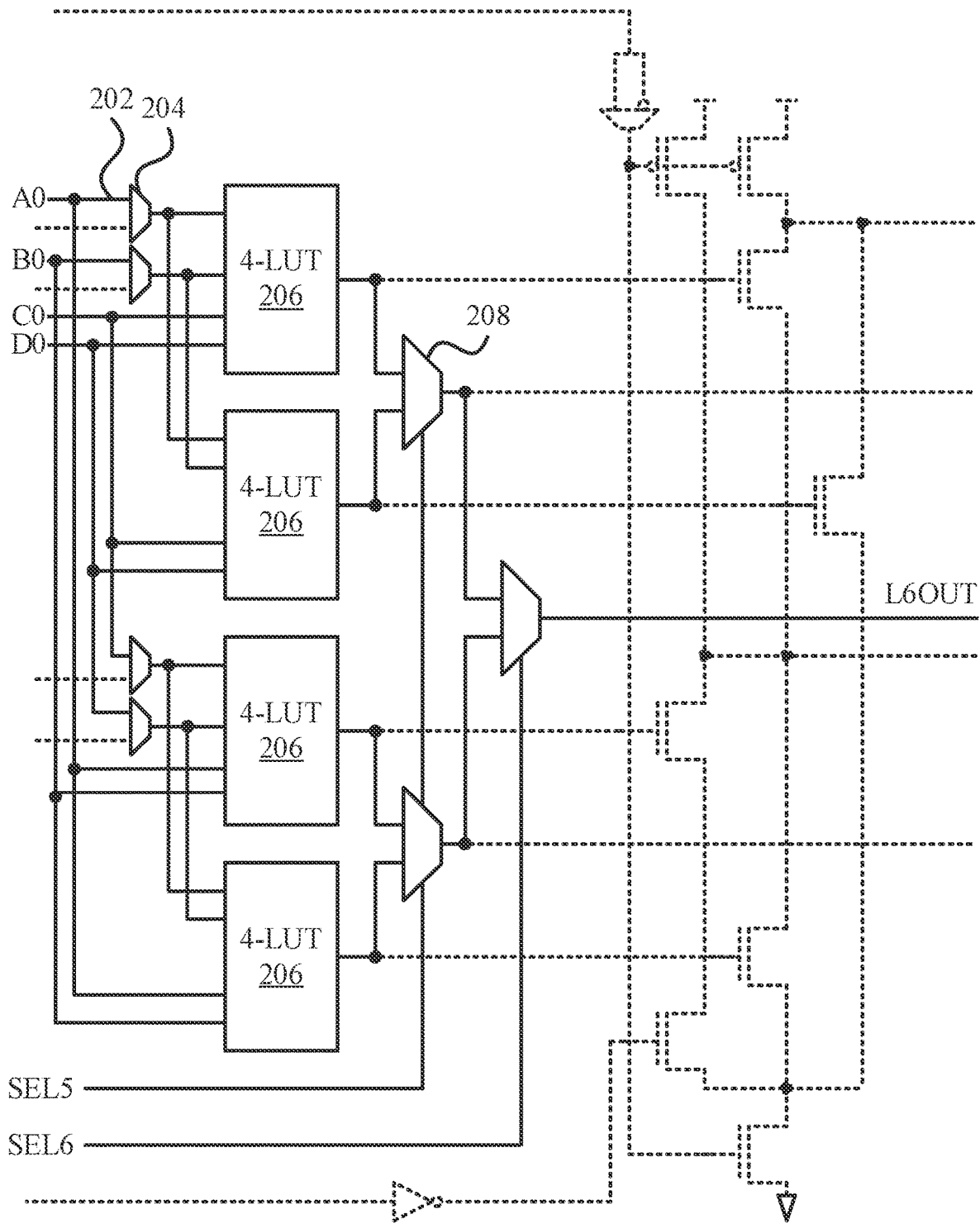
FIG. 4 is a circuit schematic that illustrates activated and deactivated portions of the configurable logic cell to show a configuration that can perform a six-input operation, in accordance with an embodiment of the present invention.

Referring now to FIG. 4, a particular configuration of the configurable cell is shown, being configured to perform a six-input operation. In this view, every component and signal that is deactivated or ignored is shown in dotted lines.

In this configuration, the input multiplexers 204 are configured to select the A0, B0, C0, and D0 signals, each of which is applied as an input to each of the four-input LUTs 206. The signals A1, B1, C1, and D1 are not used, being blocked by the input multiplexers 204. The LUT output multiplexers 208 are controlled by the SEL5 and SEL6 signals, providing a total of six bits of input. The LUT output multiplexers 208 provide a single output signal L6OUT that bypasses the domino drivers of the output region 160.

Figure 5:
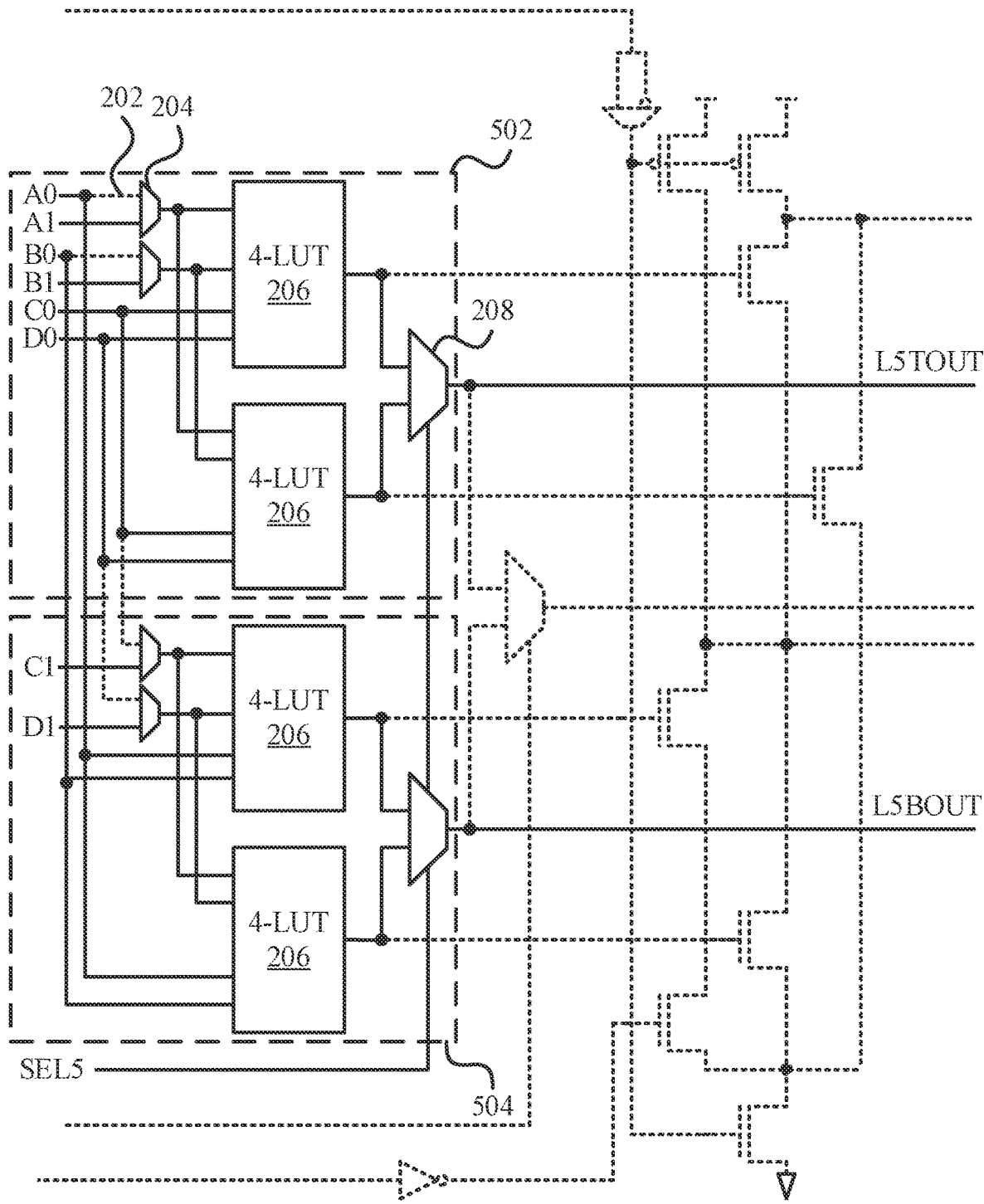
FIG. 5 is a circuit schematic that illustrates activated and deactivated portions of the configurable logic cell to show a configuration that can perform two distinct five-input operations that share an input, in accordance with an embodiment of the present invention.

Referring now to FIG. 5, a particular configuration of the configurable cell is shown, being configured to perform two operations, each of which may have five inputs, with one input being shared between the two operations. In this view, every component and signal that is deactivated or ignored is shown in dotted lines.

In this configuration, the input multiplexers 204 are used to provide two distinct sets of inputs. A first set of inputs, A0, B0, C1, and D1, are applied as inputs to each of the two four-input LUTs 206 of the bottom pair 504. A second set of inputs, A1, B1, C0, and D0, are applied as inputs to each of the two four-input LUTs 206 of the top pair 502. The output multiplexers 208 are used, along with the signal SEL5, to select between outputs of the four-input LUTs 206 in each of the top pair 502 and the bottom pair 504, to select the operation outputs L5TOUT and L5BOUT, respectively. These two inputs share a common input in the signal SEL5, which is used to trigger the output multiplexers 208 for both the top pair 502 and the bottom pair 504. Notably, the timing of the outputs of the two pairs 502 and 504 is consistent, so that no additional circuitry is needed to synchronize the outputs.

Figure 6:
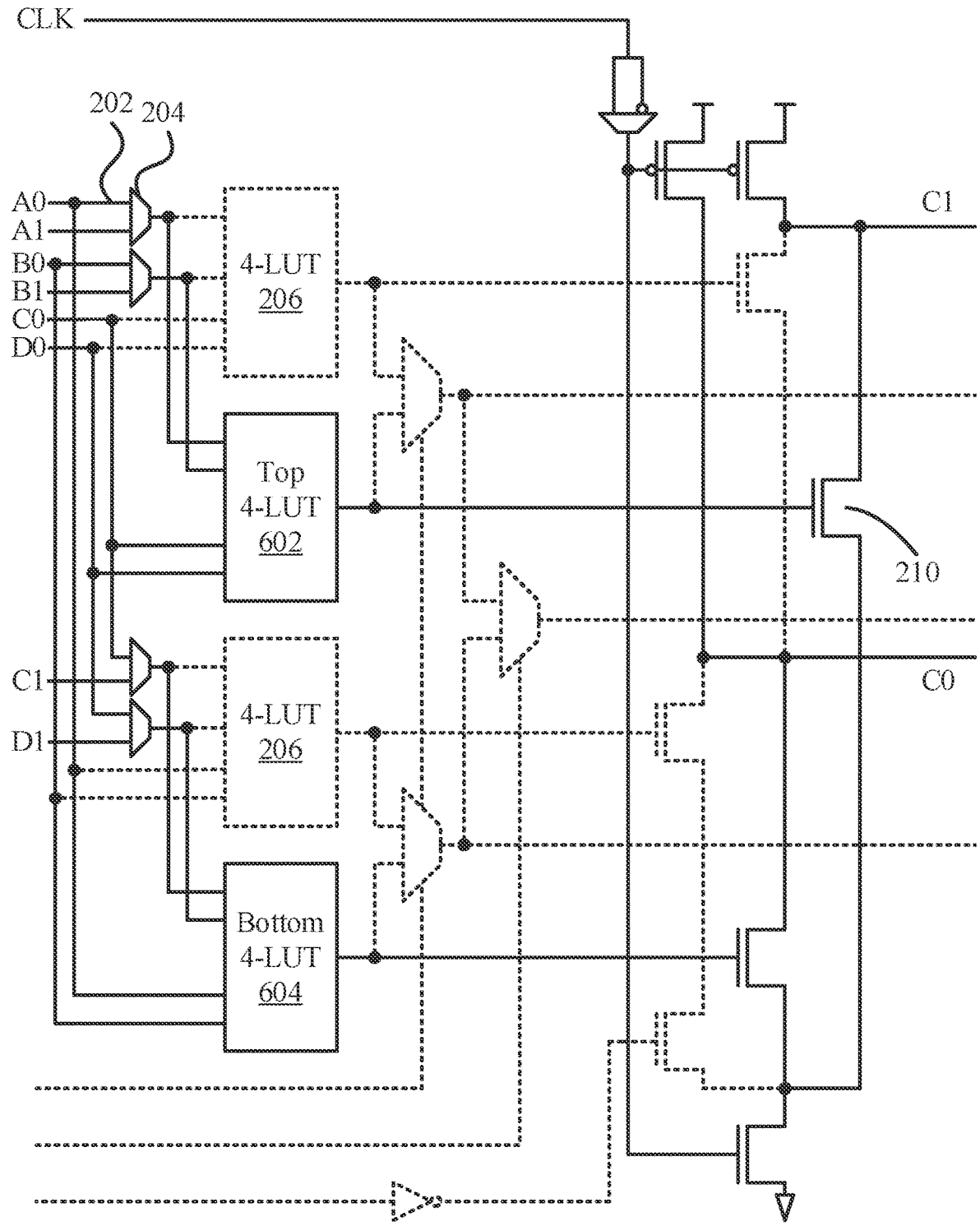
FIG. 6 is a circuit schematic that illustrates activated and deactivated portions of the configurable logic cell to show a configuration that can perform two distinct four-or-fewer-input operations, in accordance with an embodiment of the present invention.

Referring now to FIG. 6, a particular configuration of the configurable cell is shown, being configured to perform two distinct operations, each of which may have four or fewer inputs. In this view, every component and signal that is deactivated or ignored is shown in dotted lines. For those LUTs 206 which are deactivated, they may be configured to output a value of zero for any input. Thus, any transistor 210 which would otherwise be triggered by a deactivated LUT's output will similarly remain deactivated.

In this configuration, the input multiplexers 204 divide the input signals 202 in a manner similar to that shown in FIG. 5, with a first set of inputs, A1, B1, C0, and D0, being applied as inputs to a top four-input LUT 602, and with a second set of inputs, A0, B0, C1, and D1, being applied as inputs to a bottom four-input LUT 604. The remaining four-input LUTs 206 are deactivated, along with the output multiplexers. The outputs of the top LUT 602 and the bottom LUT 604 are processed by fast domino drivers 210, producing a respective top output C1 and a bottom output C0. In this configuration, both of the independent operations may have the same timing model.

Figure 7:
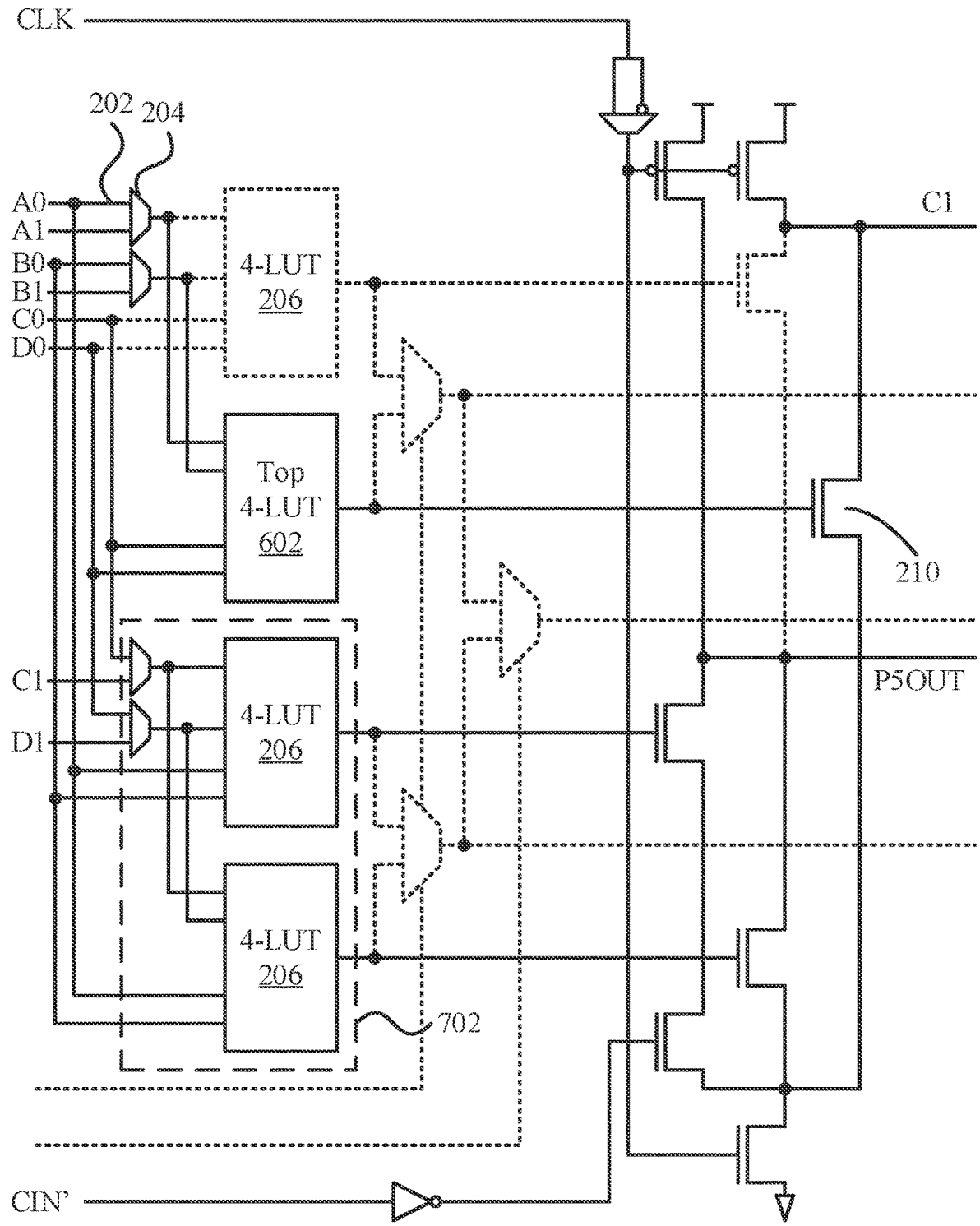
FIG. 7 is a circuit schematic that illustrates activated and deactivated portions of the configurable logic cell to show a configuration can perform that a four-or-fewer-input operation and also performs a partial five-input operation.

Referring now to FIG. 7, a particular configuration of the configurable cell is shown, being configured to perform a full four-or-fewer-input-operation and a partial five-input operation. In this view, every component and signal that is deactivated or ignored is shown in dotted lines.

In this configuration, the input multiplexers 204 again divide the input signals 202 generate two distinct sets, where inputs, A1, B1, C0, and D0 are applied as inputs to the top four-input LUT 602. The output of the top LUT 602 is designated C1.

The bottom two four-input LUTs 206 are grouped into a pair 702, and these bottom two LUTs 206 each receive inputs A0, B0, C1, and D1. A fifth input comes in the form of the CIN signal, which represents an input signal for this configuration. Thus, half of the five-input operation may be performed outside the boundaries of the circuit shown in FIG. 7, with the carry bit CIN providing the fifth input to the bottom pair 702 to complete the five-input operation. The output of the partial five-input operation is designated P5OUT.

Figure 8:
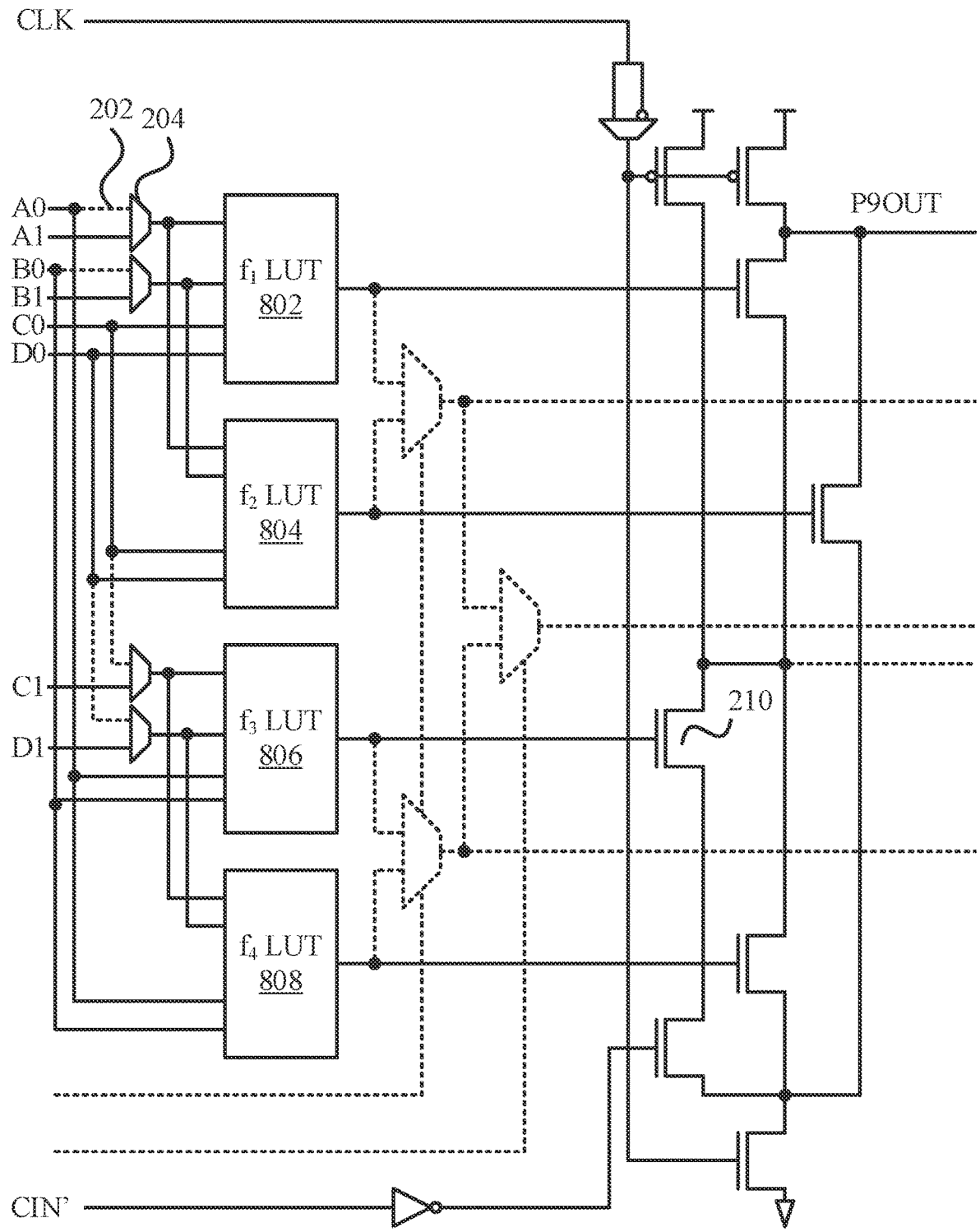
FIG. 8 is a circuit schematic that illustrates activated and deactivated portions of the configurable logic cell to show a configuration that can perform a partial nine-input operation.

Referring now to FIG. 8, a particular configuration of the configurable cell is shown, being configured to perform a partial nine-input operation. In this view, every component and signal that is deactivated or ignored is shown in dotted lines.

The input multiplexers 204 divide the input signals 202 in a manner similar to that shown in FIG. 5, with the signals A1, B1, C0, and D0 being applied as inputs to the top two LUTs 206 and with the signals A0, B0, C1, and D1 being applied as inputs to the bottom two LUTs 206. The LUTs 206 are each configured to perform different parts of the partial nine-input operation, being identified as function $f_1$ 802, function $f_2$ 804, function $f_3$ 806, and function $f_4$ 808. Thus, functions $f_1$ and $f_2$ take inputs A1, B1, C0, and D0, and functions $f_3$ and $f_4$ take inputs A0, B0, C1, and D1. Each of the functions is configured to perform a respective operation on the respective inputs, The outputs of the respective LUTs and the CIN bit are combined by the fast domino drivers 210 to produce the output P9OUT. This output signal may be expressed as P9OUT=$(f_2+(f_1 \cdot f_4)+(f_1 \cdot f_3 \cdot CIN))'$. As noted above, the + operator may represent a logical OR, while the · operator may represent a logical AND operation, while the ' operator performs a NOT.

Programmable logic devices (PLDs) are a type of integrated circuit that can be programmed to perform specified logic functions. One type of PLD, the field programmable gate array (FPGA), may include an array of programmable tiles. These programmable tiles can include, for example, input/output blocks (IOBs), configurable logic blocks (CLBs), dedicated random access memory blocks (BRAMs), multipliers, digital signal processing data path elements or blocks (DSPs), processors, clock managers, delay lock loops (DLLs), and so forth.

Each programmable tile may include both programmable interconnect and programmable logic. The programmable interconnect may include a large number of interconnect lines of varying lengths, interconnected by programmable interconnect points (PIPs), which may be configured to connect various circuit components in accordance with their operational relationships. The programmable logic implements the logic of a user design using programmable elements that can include, for example, function generators, registers, arithmetic logic, and so forth.

The programmable interconnect and programmable logic may be initialized by loading a stream of configuration data into internal configuration memory cells that define how the programmable elements operate. The configuration data can be read from memory (e.g., from an external programmable read only memory (PROM)) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD may include a two-level AND/OR structure similar to those used in Programmable Logic Arrays (PLAs) and Programmable Array Logic (PAL) devices. In CPLDs, configuration data may be stored on-chip in non-volatile memory. In some CPLDs, configuration data is stored on-chip in non-volatile memory, then downloaded to volatile memory as part of an initial configuration (programming) sequence.

For all of these programmable logic devices PLDs, the functionality of the device is controlled by data bits provided to the device for the purpose of configuring the device. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include, but are not limited to, these exemplary devices, as well as encompassing devices that are only partially programmable. For example, some types of PLD include a combination of hard-coded transistor logic and a programmable switch fabric that programmably interconnects the hard-coded transistor logic.

The present embodiments may be implemented as fixed hardware or in the form of a PLD, for example as elements of an FPGA that are configured to take the form of a circuit. As noted above, an FPGA is a device that provides reconfigurable circuitry, for example in the form of configurable logic blocks and configurable interconnects. The logic blocks may include LUTs that provide arbitrary logic operations with rapid execution.

A circuit design may be specified using a hardware description language (HDL), such as Verilog or VHDL. The HDL uses human-readable instructions in a source file to define functional relationships between components of a circuit. The HDL source file for the circuit may then be synthesized to generate a set of circuit components. In the context of FPGAs, synthesis may include identifying sets of circuit components to implement the user-specified functions. In some cases, this may include combining multiple user-specified operations into a single logic block or cell. Thus, as described herein, multiple different operations may be automatically combined into a single configurable cell. Mapping is then performed, taking the results of the synthesis and mapping circuit components onto available parts of the FPGA hardware. Routing is performed to establish connections between the components of the FPGA hardware. This process generates a set of instructions for the FPGA, sometimes called a bitfile, which the FPGA loads upon initialization to implement the circuit.

As a result, circuits may be embodied in fixed hardware, in a configured FPGA, or in a set of instructions that may be used to configure an FPGA. For example, such instructions may include an HDL source file that specifies circuit components and functions in a human-readable format. In another example, such a definition include a bitfile that provides machine-readable instructions to the FPGA hardware to implement the circuit. Such instructions may therefore be encoded in a non-transitory medium which, when read and executed by FPGA hardware, cause the FPGA hardware to initialize the circuit.

Embodiments may include circuit definition instructions that are accessible from a computer-usable or machine-readable medium providing hardware definition code for use by or in connection with an FPGA. A computer-usable or machine-readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a machine-readable storage medium such as a semiconductor or solid state memory, a removable memory device, a random access memory (RAM), a read-only memory (ROM), a flash memory, a rigid magnetic disk, an optical disk, etc.

The circuit definition instructions may be tangibly stored in a machine-readable storage media or device (e.g., flash memory or magnetic disk) readable by a general or special purpose programmable computer or by an FPGA, for setting the hardware configuration of the FPGA when the storage media or device is executed. Embodiments may also be considered to be embodied in a machine-readable storage medium, configured with a computer program, where the storage medium so configured causes an FPGA to implement one or more circuits described herein.

A data processing system suitable for storing and/or executing circuit definition instructions may include at least one processor coupled directly or indirectly to memory elements through a system bus. The memory elements can include local memory employed during compilation of the circuit definition instructions and initialization of associated circuits, bulk storage, and cache memories. Input/output or I/O devices (including but not limited to keyboards, displays, pointing devices, etc.) may be coupled to the system either directly or through intervening I/O controllers. Network adapters may also be coupled to the system enable transmission of circuit program instructions to an FPGA device. Modems, cable modem and Ethernet cards are just a few of the currently available types of network adapters.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term "direct" or "directly," in reference to a connection between two circuit components, refers to a connection that includes only a transmission line or interconnect, without any other active or passive circuit components in the connection between the two circuit components.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a configurable logic cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A configurable circuit, comprising:
   an input selection region, including a set of input multiplexers, that selects and routes input signals;
   a computation region that includes a set of lookup tables, each lookup table being coupled to selected signals from the input selection region to generate a respective output signal;
   a switching region that includes a set of output multiplexers, each output multiplexer being coupled to output signals from the set of lookup tables to provide circuit outputs responsive to respective output selection signals; and
   an output region that includes a domino logic stage, having a set of transistors, coupled to the output signals from the set of lookup tables to provide circuit outputs that determine combinations of the signals output by the set of lookup tables, wherein only one of the switching region or the output region is active for any given operation.

2. The configurable circuit of claim 1, wherein the input selection region includes four multiplexers that each receive two respective input signals and wherein the set of lookup tables includes four lookup tables.

3. The configurable circuit of claim 2, wherein the input selection region selects four signals from the input signals, A0, B0, C0, and D0, and provides the four signals to the four lookup tables during arithmetic operation, with A0 and B0 being provided as inputs to each of a first lookup table and a second lookup table of the four lookup tables and with C0 and D0 being provided as inputs to each of a third lookup table and a fourth lookup table.

4. The configurable circuit of claim 3, wherein the output region combines the signals output by the lookup tables with a carry signal to output a generate signal and a propagate signal.

5. The configurable circuit of claim 4, wherein the output region includes a set of transistors that are triggered by respective output signals of the four lookup tables and a carry bit transistor that is triggered by the carry signal.

6. The configurable circuit of claim 2, wherein the input selection region selects four signals from the input signals, A0, B0, C0, and D0, and provides the four signals to the four lookup tables during a six-input logic operation, with A0, B0, C0, and D0 being provided as inputs to each of the four lookup tables, and wherein the set of output multiplexers selects a circuit output from one of the four lookup tables in accordance with two select signal inputs.

7. The configurable circuit of claim 2, wherein the input selection region selects two distinct sets of input signals, including a first set, A1, B1, C0, and D0, and a second set, A0, B0, C1, and D1, and provides the first set as inputs to each of a first pair of lookup tables from the four lookup tables and provides the second set as inputs to a second pair of lookup tables from the four lookup tables, during split-cell operation, and wherein the set of output multiplexers selects a first output signal for the first pair of lookup tables and a second output signal for the second pair of lookup tables in accordance with a shared select signal input.

8. The configurable circuit of claim 2, wherein the input selection region selects two distinct sets of input signals, including a first set, A1, B1, C0, and D0, and a second set, A0, B0, C1, and D1, and provides the first set as inputs to a first lookup table from the four lookup tables and provides the second set as inputs to a second lookup table from the four lookup tables, during split-cell operation.

9. The configurable circuit of claim 8, wherein the output region generates a first circuit output signal from an output signal of the first lookup table and a second circuit output signal from an output signal of the second lookup table.

10. The configurable circuit of claim 2, wherein the input selection region selects two distinct sets of input signals, including a first set, A1, B1, C0, and D0, and a second set, A0, B0, C1, and D1, and provides the first set as inputs to a first lookup tables from the four lookup tables and provides the second set as inputs to each of a pair of lookup tables from the four lookup tables, during split-cell operation.

11. The configurable circuit of claim 10, wherein the output region combines the signals output by the pair of lookup tables with a carry signal to generate an output of a five-input logic operation.

12. The configurable circuit of claim 2, wherein the input selection region selects two distinct sets of input signals, including a first set, A1, B1, C0, and D0, and a second set, A0, B0, C1, and D1, and provides the first set as inputs to each of a first pair of lookup tables from the four lookup tables and provides the second set as inputs to a second pair of lookup tables from the four lookup tables, during a partial nine-input logic operation.

13. The configurable circuit of claim 12, wherein the output region combines the signals output by each of the four lookup tables with a carry signal to generate an output of the partial nine-input logic operation.

14. The configurable circuit of claim 1, wherein the configurable circuit is implemented in a single logic block of a field programmable gate array (FPGA).

15. A multi-function configurable circuit, comprising:
an input selection region, including a set of four input multiplexers, that selects and routes input signals;
a computation region that includes a set of four four-input lookup tables, each lookup table being coupled to selected signals from the input selection region to generate a respective output signal, with the computation region being split to perform multiple logic operations;
a switching region that includes a set of output multiplexers, each output multiplexer being coupled to a respective set of output signals from the set of lookup tables to provide circuit outputs responsive to respective output selection signals; and
an output region that includes a domino logic stage, having a set of transistors, coupled to the output signals from the set of lookup tables to provide circuit outputs that determine combinations of the signals output by the set of lookup tables, wherein only one of the switching region or the output region is active for any given operation.

16. The configurable circuit of claim 15, wherein each of the four four-input lookup tables receives inputs from two of the four input multiplexers.

17. The configurable circuit of claim 15, wherein the configurable circuit is implemented in a single logic block of a field programmable gate array (FPGA).

18. A configurable circuit product, the configurable circuit product having a non-transitory machine-readable storage medium that stores circuit configuration instructions, the circuit configuration instructions being readable by a field programmable gate array device to initialize a circuit that comprises:
an input selection region, including a set of input multiplexers, that selects and routes input signals;
a computation region that includes a set of lookup tables, each lookup table being coupled to selected signals from the input selection region to generate a respective output signal;
a switching region that includes a set of output multiplexers, each output multiplexer being coupled to output signals from the set of lookup tables to provide circuit outputs responsive to respective output selection signals; and
an output region that includes a domino logic stage, having a set of transistors, coupled to the output signals from the set of lookup tables to provide circuit outputs that determine combinations of the signals output by the set of lookup tables, wherein only one of the switching region or the output region is active for any given operation.

19. The configurable circuit product of claim 18, wherein the input selection region includes four multiplexers that each receive two respective input signals and wherein the set of lookup tables includes four lookup tables.

20. The configurable circuit product of claim 18, wherein the configurable circuit is implemented in a single logic block of a field programmable gate array (FPGA).

* * * * *